US012702027B2

(12) United States Patent
Lu

(10) Patent No.: US 12,702,027 B2
(45) Date of Patent: Aug. 4, 2026

(54) ELECTRONIC DEVICE

(71) Applicant: Advanced Semiconductor Engineering, Inc., Kaohsiung (TW)

(72) Inventor: Yung-Li Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 366 days.

(21) Appl. No.: 18/240,327

(22) Filed: Aug. 30, 2023

(65) Prior Publication Data

US 2025/0079323 A1     Mar. 6, 2025

(51) Int. Cl.
*H10W 70/65* (2026.01)
*H10W 40/10* (2026.01)
*H10W 70/60* (2026.01)
*H10W 90/00* (2026.01)

(52) U.S. Cl.
CPC ........... *H10W 70/65* (2026.01); *H10W 40/10* (2026.01); *H10W 70/611* (2026.01); *H10W 90/00* (2026.01)

(58) Field of Classification Search
CPC .... H01L 23/5386; H01L 23/36; H01L 25/105
See application file for complete search history.

(56) References Cited

U.S. PATENT DOCUMENTS

| | | |
|---|---|---|
| 2010/0008056 A1 | 1/2010 | Ono et al. |
| 2021/0249952 A1* | 8/2021 | Roth ..................... H02M 3/003 |
| 2023/0096368 A1* | 3/2023 | Aleksov .............. H01L 21/4857 257/531 |
| 2023/0163098 A1* | 5/2023 | Elsherbini ............... H01L 25/16 257/532 |

* cited by examiner

*Primary Examiner* — Christine A Enad
(74) *Attorney, Agent, or Firm* — Foley and Lardner LLP

(57) ABSTRACT

An electronic device is disclosed. The electronic device includes an interposer, a voltage regulator, a first circuit structure, and an electronic component. The voltage regulator is attached to the interposer. The first circuit structure is supported by the interposer. The electronic component is disposed adjacent to the interposer and electrically connected to the voltage regulator through the first circuit structure and the interposer.

20 Claims, 17 Drawing Sheets

ELECTRONIC DEVICE

BACKGROUND

1. Field of the Disclosure

The present disclosure generally relates to an electronic device.

2. Description of the Related Art

Power supply units with low power consumption and high heat dissipation are in demand for high performance computing (HPC) systems of an electronic device. Power routing paths for transmitting power signals are usually provided by a system board, over which several dies are mounted. Layout design may be constrained by the need to minimize electromagnetic interference between power signals and non-power signals (e.g., electrical signals), which can limit the ability to miniaturize the system board.

The voltage and power requirements of the dies vary, and the rapid increase in the total number and variety of dies has led to a corresponding increase in the number of power routing paths. One approach to providing more stabilized power routing paths is to provide power through the power regulating components over an interconnection structure or an interconnection die. However, this may increase the size of the electronic device and place further constraints on the level of miniaturization of the electronic device that can be achieved.

SUMMARY

In some embodiments, an electronic device includes an interposer, a voltage regulator, a first circuit structure, and an electronic component. The voltage regulator is attached to the interposer. The first circuit structure is supported by the interposer. The electronic component is disposed adjacent to the interposer and electrically connected to the voltage regulator through the first circuit structure and the interposer.

In some embodiments, an electronic device includes a first circuit structure, a second circuit structure, and a voltage regulator. The second circuit structure is disposed under the first circuit structure. The voltage regulator is configured to transmit a power between the first circuit structure and the second circuit structure. The voltage regulator vertically overlaps the first circuit structure and the second circuit structure.

In some embodiments, an electronic device includes a circuit structure and an interposer. The interposer is vertically connected to the circuit structure. The circuit structure and the interposer define a space to accommodate a voltage regulator. The interposer is configured to transmit a power to the circuit structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
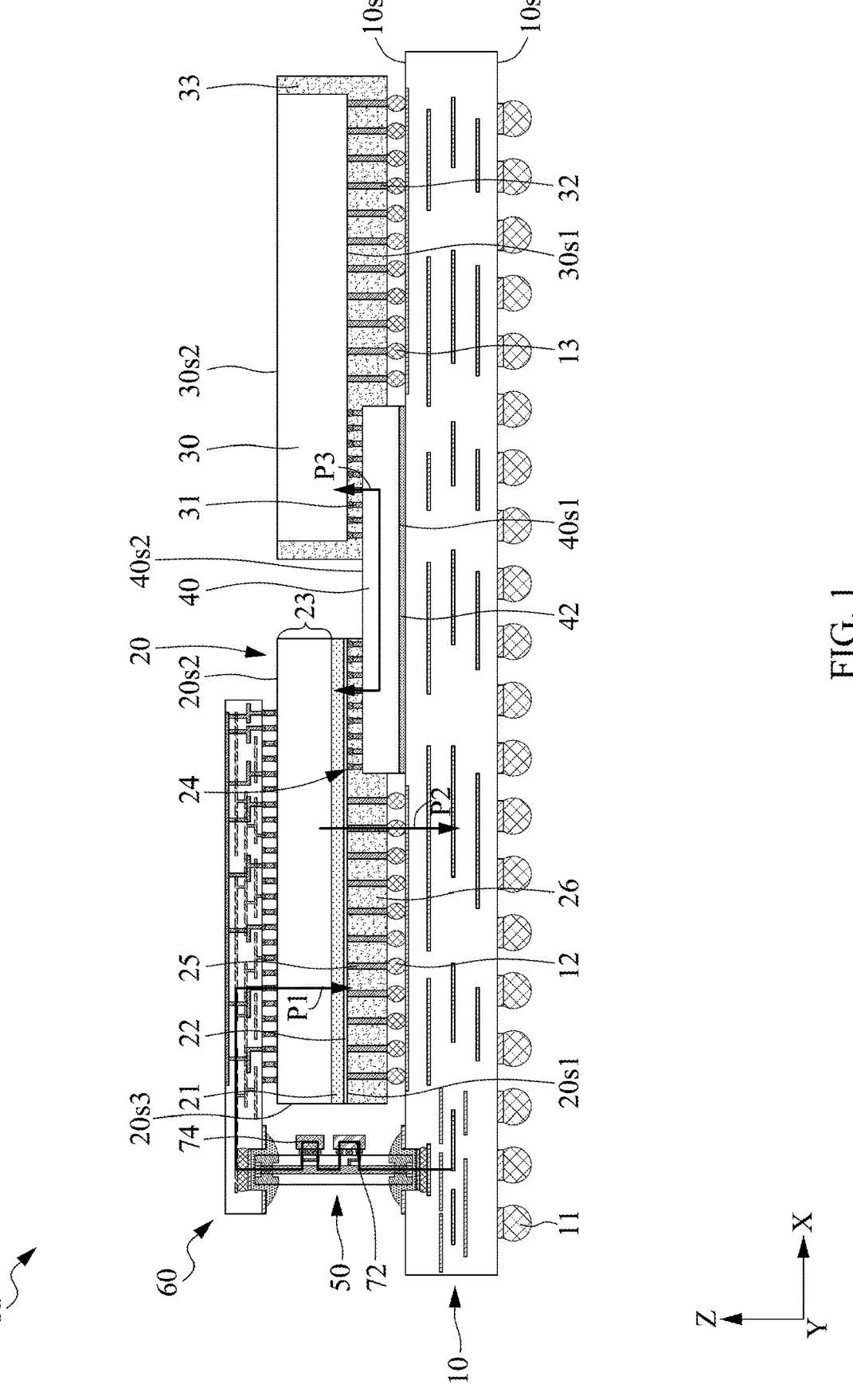
FIG. 1 illustrates a cross-sectional view of an electronic device, according to some embodiments of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

FIG. 1 illustrates a cross-sectional view of an electronic device 1a, according to some embodiments of the present disclosure. In some embodiments, the electronic device 1a may include a circuit structure 10, an electronic component 20, an electronic component 30, a bridge circuit 40, an interposer 50, a circuit structure 60, a power management integrated circuit 72, and a voltage regulator 74.

The circuit structure 10 (or a carrier or a bottom circuit structure) may include a system board, a main board, a main printed circuit board (PCB) or other suitable carriers. The circuit structure 10 may include an interconnection structure, such as a redistribution layer (RDL), a circuit layer, a conductive trace, a conductive via, or other suitable elements. The interconnection structure may provide signal paths for other components electrically connected to the circuit structure 10. For example, the circuit structure 10 may facilitate and allow communications among the components mounted over it. In some embodiments, the circuit structure 10 may receive and/or transmit a non-power signal (e.g., I/O signals) from the electronic component 20 and/or electronic component 30. In some embodiments, the circuit structure 10 may receive and/or transmit a power signal toward the interposer 50. The circuit structure 10 may have a surface 10s1 (or a lower surface) and a surface 10s2 (or an upper surface) opposite to the surface 10s1. The circuit structure 10 may include a solder resist (not shown) on the surface 10s1 and/or surface 10s2 of the circuit structure 10 to fully expose or to expose at least a portion of the conductive pads for electrical connections.

The electronic device 1a may include electrical connectors 11, 12, and 13. The electrical connector 11 may be disposed under or on the surface 10s1 of the circuit structure 10. The electrical connector 11 may be configured to electrically connect the electronic device 1a and an external device (not shown). The electrical connector 12 may be disposed on or over the surface 10s2 of the circuit structure 10. The electrical connector 12 may be configured to electrically connect the circuit structure 10 and the electronic component 20. The electrical connector 13 may be disposed on or over the surface 10s2 of the circuit structure 10. The electrical connector 13 may be configured to electrically connect the circuit structure 10 and the electronic component 30. The electrical connectors 11, 12, and 13 may include a solder ball, such as a controlled collapse chip connection (C4) bump, a ball grid array (BGA), a land grid array (LGA), and so on. The electrical connectors 11, 12, and 13 may include a solder material, which may include alloys of gold and tin solder or alloys of silver and tin solder, or other suitable materials.

The electronic component 20 may be disposed on or over the surface 10s2 of the circuit structure 10. The electronic component 20 may be electrically connected to the circuit structure 10 through the electrical connector 12. The electronic component 20 may include a chip. In some embodiments, the electronic component 20 may include an active component that relies on an external power supply to control, output, or modify electrical signals. For example, the electronic component 20 may include a processor, a controller, a memory, or an input/output (I/O) buffer, etc.

The electronic component 20 may include a logic die (e.g., an application-specific IC (ASIC), application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The electronic component 20 may include a surface 20s1 (or a lower surface or a front surface) and a surface 20s2 (or an upper surface or a backside surface or a passive surface). The surface 20s1 may face the circuit structure 10. The surface 20s2 may be opposite to the surface 20s1. In some embodiments, the surface 20s1 may be configured to transmit an input/output (I/O) signal, which may include or be composed of alternating current (AC). In some embodiments, the surface 20s2 may be configured to receive power, which may include or be composed of direct current (DC).

The electronic component 20 may include a logic circuit 21, a front redistribution structure 22, and a backside redistribution structure 23. The logic circuit 21 may be located adjacent to or formed on the surface 20s1 of the electronic component 20. The logic circuit 21 may include one or more ICs configured to generate a non-power signal(s), such as an I/O signal or signals in communication with other electronic components.

The front redistribution structure 22 may be disposed adjacent to the surface 20s1 of the electronic component 20. The front redistribution structure 22 may also be referred to as a fan-in structure. The front redistribution structure 22 may include conductive traces (not shown) and conductive vias (not shown) disposed on or within dielectric layers. The front redistribution structure 22 may be configured to transmit a non-power signal(s), such as an I/O signal or other signals or signals in communication with other electronic components.

The backside redistribution structure 23 may extend between the surface 20s2 and the logic circuit 21. The backside redistribution structure 23 may function as a power delivery circuit. The backside redistribution structure 23 may include conductive traces (not shown) and conductive vias (not shown) configured to transmit power (or a power signal), from the surface 20s2, to the logic circuit 21.

The electronic device 1a may include conductive structures 24. The conductive structure 24 may be configured to electrically connect the electronic component 20 and the bridge circuit 40. The conductive structure 24 may include multiple conductive elements, such as conductive pads, solder elements, and/or other suitable elements. The conductive pad may include a conductive material(s), such as copper (Cu), aluminum (Al), tungsten (W), titanium (Ti), tantalum (Ta), or other applicable materials. The solder elements may include alloys of gold and tin solder or alloys of silver and tin solder, or other suitable materials.

The electronic device 1a may include conductive structures 25. The conductive structure 25 may be configured to electrically connect the electronic component 20 and the circuit structure 10. The conductive structure 25 may include multiple conductive elements, such as conductive pillars and/or other suitable elements. The conductive pillars may include a conductive material(s), such as copper (Cu), aluminum (Al), tungsten (W), titanium (Ti), tantalum (Ta), or other applicable materials.

The electronic device 1a may include an encapsulant 26. The encapsulant 26 may be disposed on or under the surface 20s1 of the electronic component 20. In some embodiments, the encapsulant 26 may cover the bridge circuit 40. The encapsulant 26 may encapsulate the conductive structures 24 and 25. The encapsulant 26 may include insulation or dielectric materials. In some embodiments, the encapsulant 26 may be made of molding material that may include, for example, a Novolac-based resin, an epoxy-based resin, a silicone-based resin, or another suitable encapsulant. Suitable fillers may also be included, such as powdered $SiO_2$.

The electronic component 30 may be disposed on or over the surface 10s2 of the circuit structure 10. The electronic component 30 may be electrically connected to the circuit structure 10 through the electrical connector 13. The electronic component 30 may include a chip. The electronic component 30 may include a processor, a controller, a memory, or an input/output (I/O) buffer, etc. The electronic component 30 may include a logic die (e.g., an application-specific IC (ASIC), application processor (AP), system-on-a-chip (SoC), central processing unit (CPU), graphics processing unit (GPU), microcontroller, etc.), a memory die (e.g., high bandwidth memory (HBM), dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active component. The electronic component 30 may include a surface 30s1 and a surface 30s2 opposite to the surface 30s1. The surface 30s1 may face the circuit structure 10. The surface 30s2 may be opposite to the surface 30s1. The surface 30s1 may be referred to as an active surface. The surface 30s2 may be referred to as a passive surface. Although not shown, the electronic component 30 may include an IC layer or IC region adjacent to the surface 30s1.

The electronic device 1a may include conductive structures 31. The conductive structure 31 may be configured to electrically connect the electronic component 30 and the bridge circuit 40. The conductive structure 31 may include multiple conductive elements, such as conductive pads, solder elements, and/or other suitable elements.

The electronic device 1a may include conductive structures 32. The conductive structure 32 may be configured to electrically connect the electronic component 30 and the circuit structure 10. The conductive structure 32 may include multiple conductive elements, such as conductive pillars and/or other suitable elements.

The electronic device 1a may include an encapsulant 33. The encapsulant 33 may be disposed on or under the surface 30s1 of the electronic component 30. In some embodiments, the encapsulant 33 may cover a lateral surface (not annotated) of the electronic component 30. In some embodiments, the encapsulant 33 may cover the bridge circuit 40. The encapsulant 33 may encapsulate the conductive structures 31 and 32. The encapsulant 33 may include insulation or dielectric materials. In some embodiments, the encapsulant 33 may be made of molding material that may include, for example, a Novolac-based resin, an epoxy-based resin, a silicone-based resin, or another suitable encapsulant. Suitable fillers may also be included, such as powdered $SiO_2$.

The bridge circuit 40 may be disposed on or over the surface 10s2 of the circuit structure 10. The bridge circuit 40 may be configured to transmit a signal (e.g., non-power signal) between the electronic components 20 and 30. In some embodiments, the bridge circuit 40 may be a bridge die. The bridge circuit 40 may include integrated circuits. In some embodiments, the bridge circuit 40 may include a high-level data link control (HDLC) chip. The bridge circuit 40 may include a surface 40s1 (or a lower surface) and a surface 40s2 (or an upper surface) opposite to the surface 40s1. In some embodiments, the bridge circuit 40 may include a redistribution structure (not shown) adjacent to the surface 40s2 for electrically connecting the electronic components 20 and 30. In some embodiments, the surface 40s2 of the bridge circuit 40 may be covered by the encapsulant 26. In some embodiments, the surface 40s2 of the bridge circuit 40 may be covered by the encapsulant 33. In some embodiments, the lateral surface (not annotated) of the bridge circuit 40 may be covered by the encapsulant 26. In some embodiments, the lateral surface of the bridge circuit 40 may be covered by the encapsulant 33.

The electronic device 1a may include a thermal transmission structure 42. The thermal transmission structure 42 may be disposed on or under the surface 40s1 of the bridge circuit 40. In some embodiments, the thermal transmission structure 42 may be configured to provide a thermal transmission path for dissipating a heat from the bridge circuit 40. The thermal transmission structure 42 may be configured to attach the bridge circuit 40 to the circuit structure 10. In some embodiments, the thermal transmission structure 42 may include a glue, a thermal interface material (TIM), or other suitable materials. In some embodiments, the thermal transmission structure 42 may include a thermal plate made of metal or other suitable materials.

In some embodiments, the interposer 50 may be disposed on or over the surface 10s2 of the circuit structure 10. In some embodiments, the interposer 50 may be disposed between the circuit structures 10 and 60. In some embodiments, the interposer 50 may laterally overlap or be aligned with the bridge circuit 40 along the X direction. In some embodiments, the interposer 50 may laterally overlap or be aligned with the electronic component 20 along the X direction. The interposer 50 may be disposed adjacent to a surface 20s3 (or a lateral surface) of the electronic component 20. In some embodiments, the interposer 50 may be configured to receive and/or transmit power (or power signal) and/or regulated power (or a regulated power signal). In some embodiments, the electronic component 20 may be disposed between the interposer 50 and the electronic component 30.

In some embodiments, the circuit structure 60 may be disposed on or over the surface 20s2 of the electronic component 20. The circuit structure 60 may be disposed on or over the interposer 50. In some embodiments, the circuit structure 60 may connect the electronic component 20 and the interposer 50. In some embodiments, the electronic component 30 may be free from overlapping the circuit structure 60. In some embodiments, the circuit structure 60 may be supported by the interposer 50. The circuit structure 60 may be configured to electrically connect the electronic component 20 and the interposer 50. In some embodiments, the circuit structure 60 may vertically overlap or be aligned with the interposer 50 along the Z direction. The circuit structure 60 may cover the interposer 50. In some embodiments, the circuit structure 60 may vertically overlap or be aligned with the electronic component 20 along the Z direction. The circuit structure 60 may cover the electronic component 20. In some embodiments, a portion of the surface 20s2 of the electronic component 20 may be exposed by the circuit structure 60. In some embodiments, the circuit structure 60 may be configured to receive and/or transmit power (or power signal) and/or regulated power (or a regulated power signal) from the interposer 50 to the electronic component 20. In some embodiments, the circuit structure 60 may be configured to receive and/or transmit a ground signal to the electronic component 20.

Figure 2A:
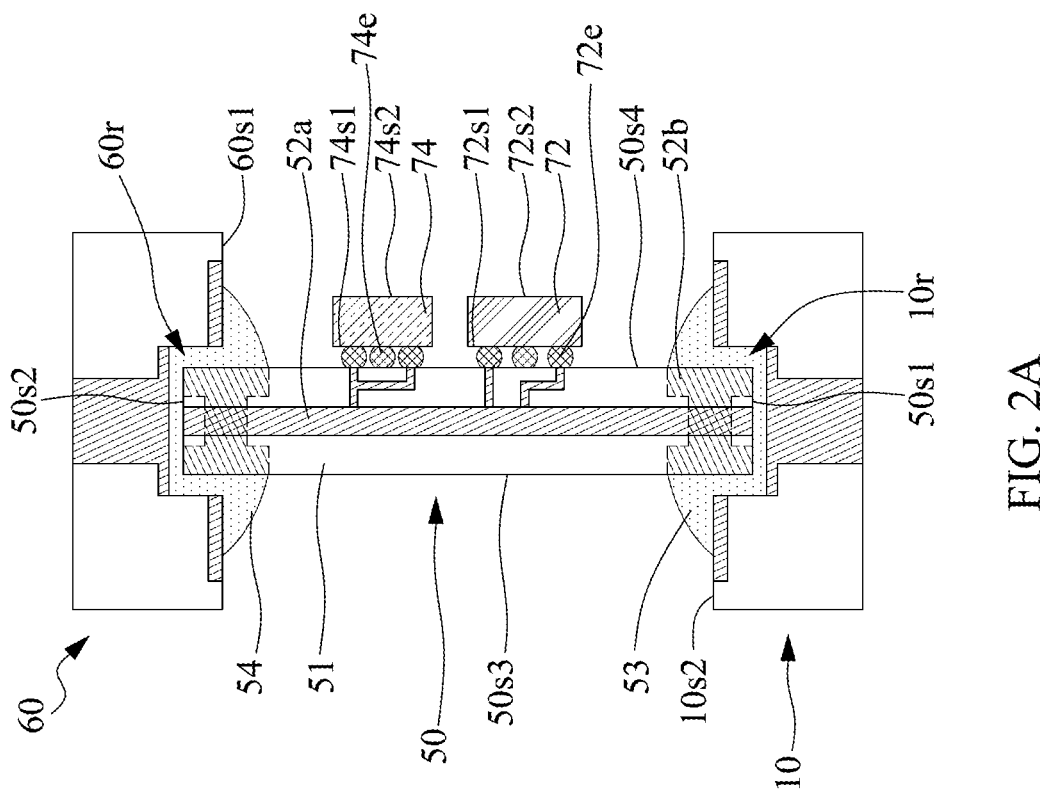
FIG. 2A illustrates an enlarged view of an interposer of the electronic device as shown in FIG. 1, according to some embodiments of the present disclosure.

Referring to FIG. 2A, the interposer 50 may vertically extend between the circuit structures 10 and 60. In some embodiments, the interposer 50 may vertically overlap or be aligned with the circuit structure 10 along the Z direction. In some embodiments, the interposer 50 may vertically overlap or be aligned with the circuit structure 60 along the Z direction. The interposer 50 may include a surface 50s1 (or a lower surface) and a surface 50s2 (or an upper surface) opposite to the surface 50s1. The surface 50s1 may face the circuit structure 10. The surface 50s2 may face the circuit structure 60. The interposer 50 may include a surface 50s3 (or a lateral surface or a lateral side surface) and a surface 50s4 (or a lateral surface or a lateral side surface) opposite to the surface 50s3. The surface 50s4 may face the electronic component 20 as shown in FIG. 1. The surface 50s3 may face away from the electronic component 20 as shown in FIG. 1. The interposer 50 may include a substrate 51 and power delivery traces 52a and 52b. The interposer 50 may include one or more conductive pads (not shown) in proximity to, adjacent to, embedded in, and/or exposed by the surface 50s1 and/or surface 50s2 of the interposer 50. The surface 50s4 may be substantially parallel to the surface 20s3 as shown in FIG. 1.

In some embodiments, the substrate 51 may have a relatively great rigidity so that the substrate 51 may support the circuit structure 60. The substrate 51 may include a benzocyclobutene (BCB) based polymer or a polyimide (PI). The substrate 51 may include additional additives and/or fillers to enhance the rigidity.

The power delivery trace 52a (illustrated by a solid line) and the power delivery trace 52b (illustrated by a dotted line) may be embedded within the substrate 51. The power delivery trace 52a (or 52b) may be configured to transmit power (or power signal) and/or regulated power (or a regulated power signal). The power delivery traces 52a and 52b may be configured to electrically connect the circuit structure 10, the power management integrated circuit 72, the voltage regulator 74, and the circuit structure 60.

In some embodiments, the interposer 50 may be inserted into or partially located within a recess 10r defined by the circuit structure 10. The recess 10r may be recessed from the surface 10s2. In some embodiments, the interposer 50 may be electrically connected to the circuit structure 10 by electrical connectors 53. The electrical connector 53 may be configured to electrically connect the circuit structure 10 and the interposer 50. The electrical connector 53 may at least partially fill the recess 10r of the circuit structure 10. The electrical connector 53 may be disposed on or over the surface 10s2 of the circuit structure 10. The electrical connector 53 may include a solder material, which may include alloys of gold and tin solder or alloys of silver and tin solder, or other suitable materials. In some embodiments, the interposer 50 may be inserted into or partially located within the electrical connector 53, which thereby increases the contact area between the interposer 50 and the electrical connector 53.

In some embodiments, the interposer 50 may be inserted into or partially located within a recess 60r defined by the circuit structure 60. The recess 60r may be recessed from a surface 60s1 (or a lower surface). In some embodiments, the interposer 50 may be electrically connected to the circuit structure 60 by electrical connectors 54. The electrical connector 54 may be configured to electrically connect the circuit structure 60 and the interposer 50. The electrical connector 54 may at least partially fill the recess 60r of the circuit structure 60. The electrical connector 54 may be disposed on or under the surface 60s1 of the circuit structure 60. The electrical connector 54 may include a solder material, which may include alloys of gold and tin solder or alloys of silver and tin solder, or other suitable materials. In some embodiments, the interposer 50 may be inserted into or partially located within the electrical connector 54, which thereby increases the contact area between the interposer 50 and the electrical connector 54.

Figure 2B:
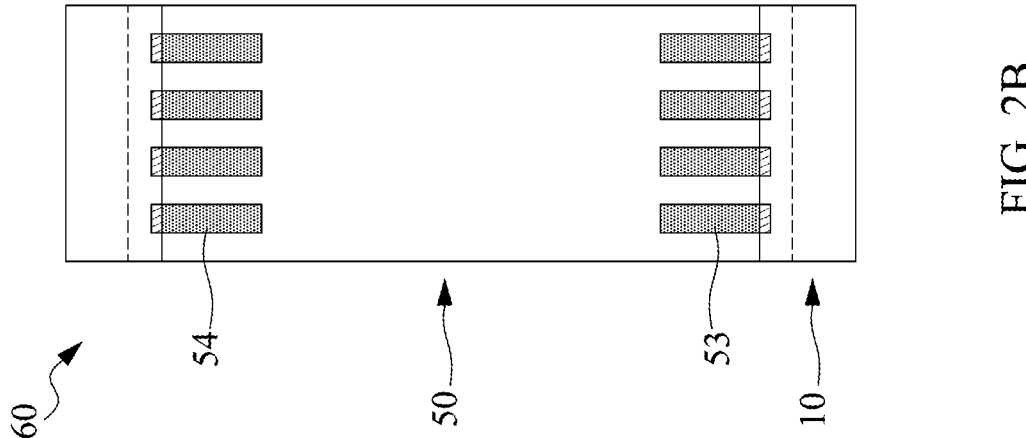
FIG. 2B illustrates a cross-sectional view of the interposer from another perspective, according to some embodiments of the present disclosure.
Figure 2B:
Figure 2B:
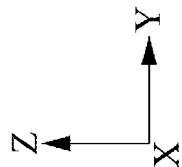

As shown in FIG. 2B, each of the electrical connectors 53 may be configured to electrically connect corresponding terminals (e.g., conductive pads) of the circuit structure 10. Each of the electrical connectors 54 may be configured to electrically connect corresponding terminals (e.g., conductive pads) of the circuit structure 60.

Referring back to FIG. 2A, the power management integrated circuit 72 may be disposed on the surface 50s4 of the interposer 50. The power management integrated circuit 72 may be electrically connected to the interposer 50 by, for example, a solder material 72e. The power management integrated circuit 72 may be disposed between the circuit structures 10 and 60 along the Z direction. The power management integrated circuit 72 may be electrically connected to the interposer 50 using a flip-chip technique. The power management integrated circuit 72 may have a dimension (e.g., a volume or a surface area) smaller than that of the electronic component 20. In some embodiments, the power management integrated circuit 72 may vertically overlap or be aligned with the circuit structure 10 along the Z direction. In some embodiments, the power management integrated circuit 72 may vertically overlap or be aligned with the circuit structure 60 along the Z direction. In some embodiments, the power management integrated circuit 72 may include an alternating current (AC)-to-Direct Current (DC) (AC/DC) converter and a DC-to-DC (DC/DC) converter. The power management integrated circuit 72 may be configured to manage multiple input powers (or power signals) from the circuit structure 10. For example, the power management integrated circuit 72 may be configured to tune or stabilize multiple input powers (or power signals) and transmit (or distribute) tuned or stabilized powers to the circuit structure 60. The power management integrated circuit 72 may have a surface 72s1 (or a front surface or an active surface) and a surface 72s2 (or a backside surface or a passive surface) opposite to the surface 72s1. The integrated circuits of the power management integrated circuit 72 may be disposed adjacent to the surface 72s1. In some embodiments, the surface 72s2 of the power management integrated circuit 72 may face the electronic component 20 as shown in FIG. 1.

In some embodiments, the voltage regulator 74 may be disposed on the surface 50s4 of the interposer 50. The voltage regulator 74 may be electrically connected to the interposer 50 by, for example, a solder material 74e. The voltage regulator 74 may be disposed between the circuit structures 10 and 60 along the Z direction. The voltage regulator 74 may be electrically connected to the interposer 50 using a flip-chip technique. The voltage regulator 74 may have a dimension (e.g., a volume or a surface area) smaller than that of the electronic component 20. In some embodiments, the voltage regulator 74 may vertically overlap or be aligned with the circuit structure 10 along the Z direction. In some embodiments, the voltage regulator 74 may vertically overlap or be aligned with the circuit structure 60 along the Z direction. In some embodiments, the voltage regulator 74 may vertically overlap or be aligned with the power management integrated circuit 72 along the Z direction. The voltage regulator 74 may be configured to provide the electronic component 20 with power (or power signal) and/or regulated power (or a regulated power signal). The voltage regulator 74 may include a linear regulator (which is configured to maintain a constant output voltage) or a switching regulator (which is configured to generate an output voltage higher than or lower than an input voltage). In some embodiments, the voltage regulator 74 may include a step-down (buck) converter, a step-up (boost) converter, an analog-to-digital converter, a digital-to-analog converter, an AC/DC converter, a DC/DC converter, other types of converters, or a combination thereof. The voltage regulator 74 may have a surface 74s1 (or a front surface or an active surface) and a surface 74s2 (or a backside surface or a passive surface) opposite to the surface 74s1. The integrated circuits of the voltage regulator 74 may be disposed adjacent to the surface 74s1. In some embodiments, the surface 74s2 of the voltage regulator 74 may face the electronic component 20 as shown in FIG. 1.

Figure 2C:
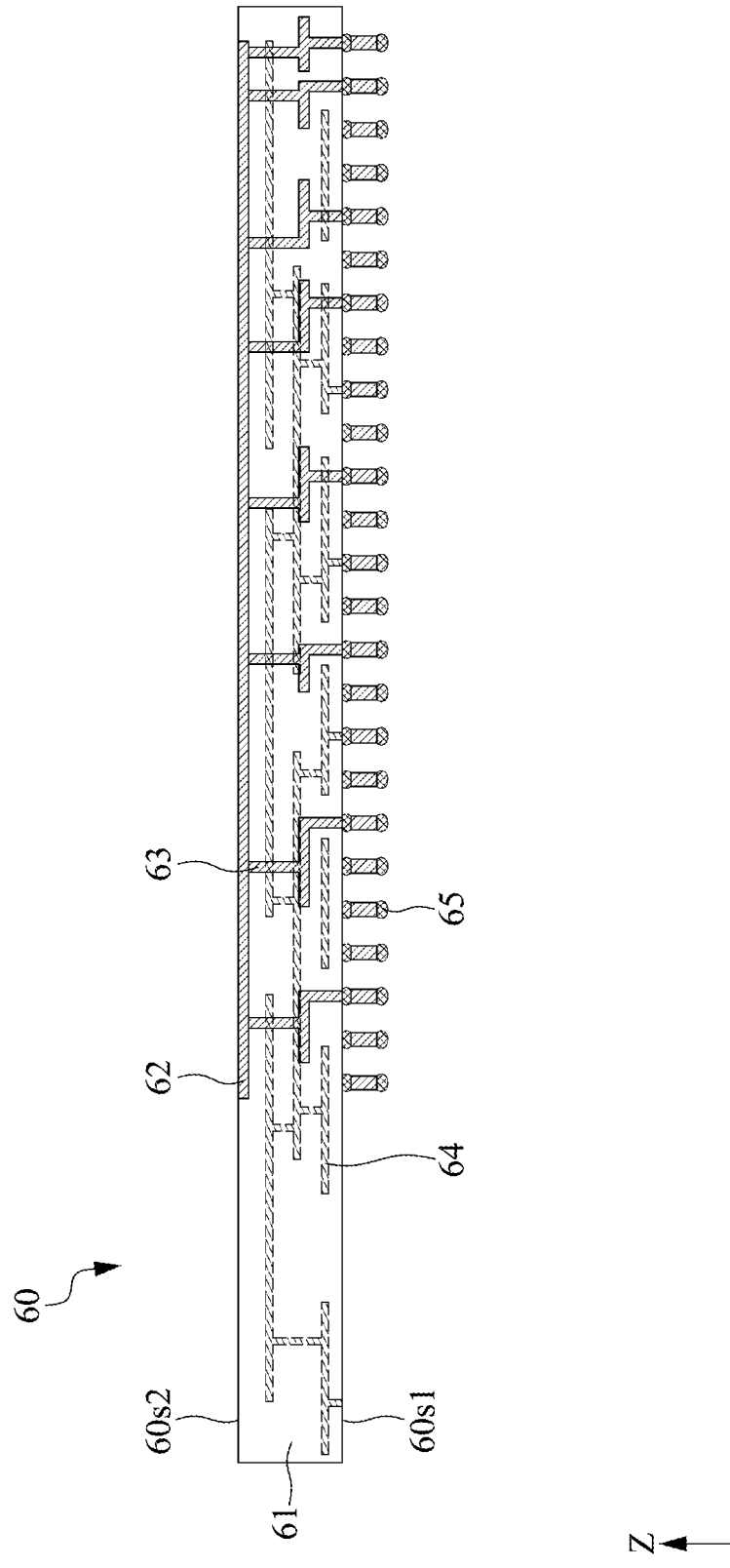
FIG. 2C illustrates an enlarged view of a circuit structure of the electronic device as shown in FIG. 1, according to some embodiments of the present disclosure.

Referring to FIG. 2C, the circuit structure 60 may have a surface 60s2 (or an upper surface) opposite to the surface 60s1. The circuit structure 60 may include a substrate 61, a ground layer 62, a ground circuit 63, and a power delivery circuit 64. The substrate 61 may include one or more dielectric layers, which is formed by a polyimide, a phenolic compound or other suitable materials.

The ground layer 62 may be disposed adjacent to the surface 60s2 of the circuit structure 60. In some embodiments, the ground layer 62 may be exposed by the surface 60s2. The ground layer 62 may be electrically connected to ground. In some embodiments, the ground layer 62 may also function as a heat dissipating layer.

The ground circuit 63 (illustrated by a solid line) may be electrically connected to the ground layer 62. The ground circuit 63 may include one or more conductive traces and conductive vias embedded within the substrate 61.

The power delivery circuit 64 (illustrated by a dotted line) may be electrically connected to the interposer 50 as shown in FIG. 1. The power delivery circuit 64 may include one or more conductive traces and conductive vias embedded within the substrate 61. In some embodiments, the power delivery circuit 64 may be configured to receive and/or transmit power (or power signal) and/or regulated power (or a regulated power signal) from the interposer 50 to the electronic component 20.

The electronic device 1a may include conductive structures 65. The conductive structure 65 may be disposed on or under the surface 60s1 of the circuit structure 60. The conductive structure 65 may be configured to electrically connect the circuit structure 60 and electronic component 20. The conductive structure 65 may include multiple conductive elements, such as conductive pads, solder elements, and/or other suitable elements.

Referring back to FIG. 1, the electronic device 1a may include a path P1. The path PI may be a power path. In some embodiments, the path P1 illustrates a transmission path of power (or a power signal) and/or regulated power (or a regulated power signal). The path PI may pass through the interposer 50. The path P1 may pass through the power management integrated circuit 72. The path PI may pass through the voltage regulator 74. The path PI may pass through the circuit structure 60. The path PI may pass through the surface 20s2 of the electronic component 20. In some embodiments, power (or a power signal) and/or regulated power (or a regulated power signal) may vertically pass through the interposer 50.

The electronic device 1a may include a path P2. The path P2 may be a non-power path. In some embodiments, the path P2 illustrates a transmission path of a non-power signal, such as an I/O signal. The path P2 may be transmitted from the surface 20s1 of the electronic component 20 to the circuit structure 10.

The electronic device 1a may include a path P3. The path P3 may be a non-power path. In some embodiments, the path P3 illustrates a transmission path of a non-power signal, such as an I/O signal. The path P3 may be transmitted between the electronic components 20 and 30. The bridge circuit 40 may provide a horizontal transmission path for transmitting a signal (or a non-power signal). In some embodiments, the path P3 may pass through the surface 20s1 of the electronic component 20. The path P3 may pass through the surface 40s2 of the bridge circuit 40. The path P3 may pass through the surface 30s1 of the electronic component 30.

In some embodiments, the electronic device 1a may include an encapsulant (not shown) that encapsulates the electronic component 20, the encapsulant 33, the bridge circuit 40, the interposer 50, the circuit structure 60, the power management integrated circuit 72, and the voltage regulator 74. Said encapsulant may include a material the same as or similar to that of the encapsulant 26.

In this embodiment, the path of signal and the path of power pass through two opposite surfaces of the electronic component 20 so that power and signal can be free of interference by each other. In a comparative example, a voltage regulator (or a PMIC) is stacked over an electronic component or a circuit structure over the electronic component in order to provide power from a backside surface of the electronic component. As a result, the thickness of an electronic device increases. In this embodiment, the power management integrated circuit 72 (or the voltage regulator 74), which has a smaller dimension, is accommodated within a space defined by the circuit structure 10, the interposer 50, and the circuit structure 60, which thereby reduces the thickness of the electronic device 1a. The electronic component 20 is disposed within said space and spaced apart from the power management integrated circuit 72 (or the voltage regulator 74). The power management integrated circuit 72 (or the voltage regulator 74) is attached to a lateral surface of the interposer 50, which provides a relatively short power transmission path. Further, the interposer 50 may be inserted into the circuit structure 10 through the electrical connector 53, which thereby increases the contact area between the circuit structure 10 and the interposer 50. As a result, the resistance is reduced, leading to an improvement with regard to power loss.

Figure 3:
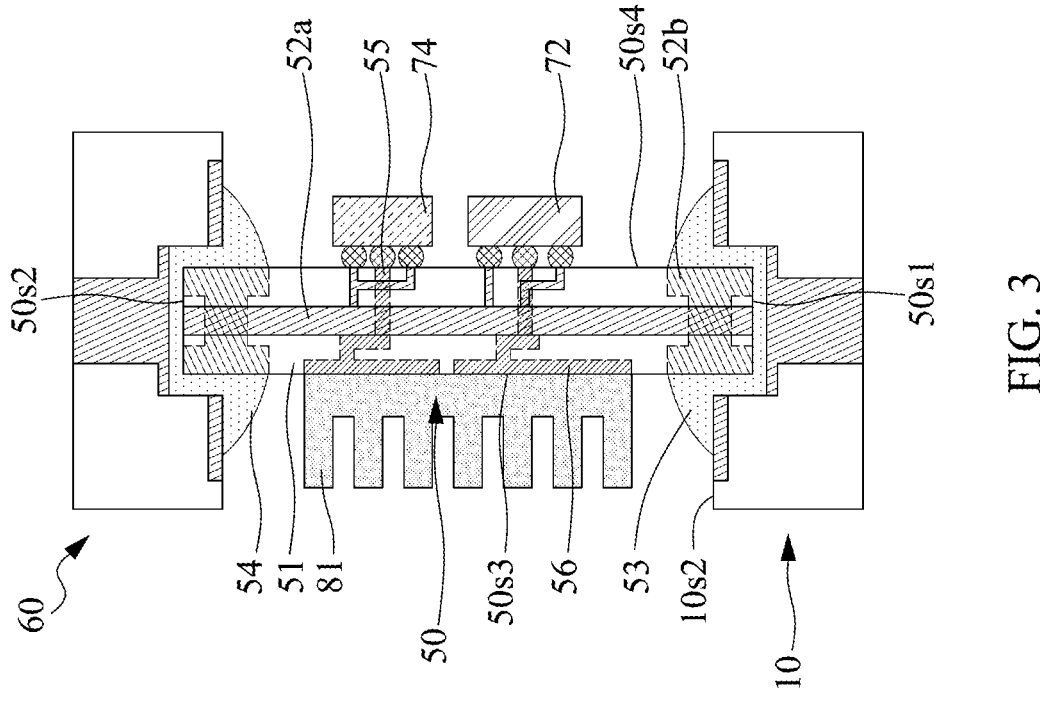
FIG. 3 illustrates a cross-sectional view of an electronic device, according to some embodiments of the present disclosure.

FIG. 3 illustrates a cross-sectional view of an electronic device 1b, according to some embodiments of the present disclosure. The electronic device 1b may be similar to the electronic device 1a, with differences therebetween as follows.

In some embodiments, the electronic device 1b may include a heat spreader 81. In some embodiments, the heat spreader 81 may be disposed on the surface 50s3 of the interposer 50. The voltage regulator 74 and the heat spreader 81 may be disposed on two different sides (e.g., surfaces 50s3 and 50s4) of the interposer 50. For example, the voltage regulator 74 may be disposed on or attached to the surface 50s4, and the heat spreader 81 may be disposed on or attached to the surface 50s3. In other embodiments, the heat spreader 81 may be disposed on or attached to a side abutting the surface 50s4.

In some embodiments, the heat spreader 81 may vertically overlap or be aligned with the circuit structure 10 along the Z direction. In some embodiments, the heat spreader 81 may vertically overlap or be aligned with the circuit structure 60 along the Z direction. The heat spreader 81 may include a heat sink, such as heat dissipation fins as shown, extending along directions substantially perpendicular to the surface 50s3 of the interposer 50 from a base portion. In some embodiments, the heat spreader 81 may include, but is not limited to, a solid metal slug or an electrical insulator coated with metallic film. In some embodiments, the heat spreader 81 may have one or more conductive layers. For example, the heat spreader 81 may include copper (Cu), aluminum (Al), gold (Au), nickel (Ni) and/or other suitable layers. The heat spreader 81 may also include aluminum oxide ($Al_2O_3$), aluminum nitride (AlN), or silicon nitride (SiN) plate coated with copper. In some embodiments, the heat spreader 81 may include a first layer which functions as a thermally conductive layer with a greater thickness and a second layer which functions as a protective layer with a less thickness. The heat spreader 81 may be configured to facilitate dissipating heat from the power management integrated circuit 72 and/or the voltage regulator 74.

In some embodiments, the interposer 50 may include heat transmission traces 55 and 56. The heat transmission trace 55 may be spaced apart from the power delivery trace 52a (or power delivery trace 52b). The heat transmission trace 55 may connect the voltage regulator 74 and the heat spreader 81. The heat transmission trace 56 may be spaced apart from the power delivery trace 52a (or power delivery trace 52b). The heat transmission trace 56 may connect the power management integrated circuit 72 and the heat spreader 81. The heat spreader 81 may be connected to the substrate 51 through an adhesive layer (not shown). The adhesive layer may include a conductive material, a dielectric layer, and/or a thermal conductive material. The heat transmission trace 55 (or heat transmission trace 56) may be configured to provide a heat transmission path between the heat spreader 81 and the voltage regulator 74 (or power management integrated circuit 72).

Figure 4:
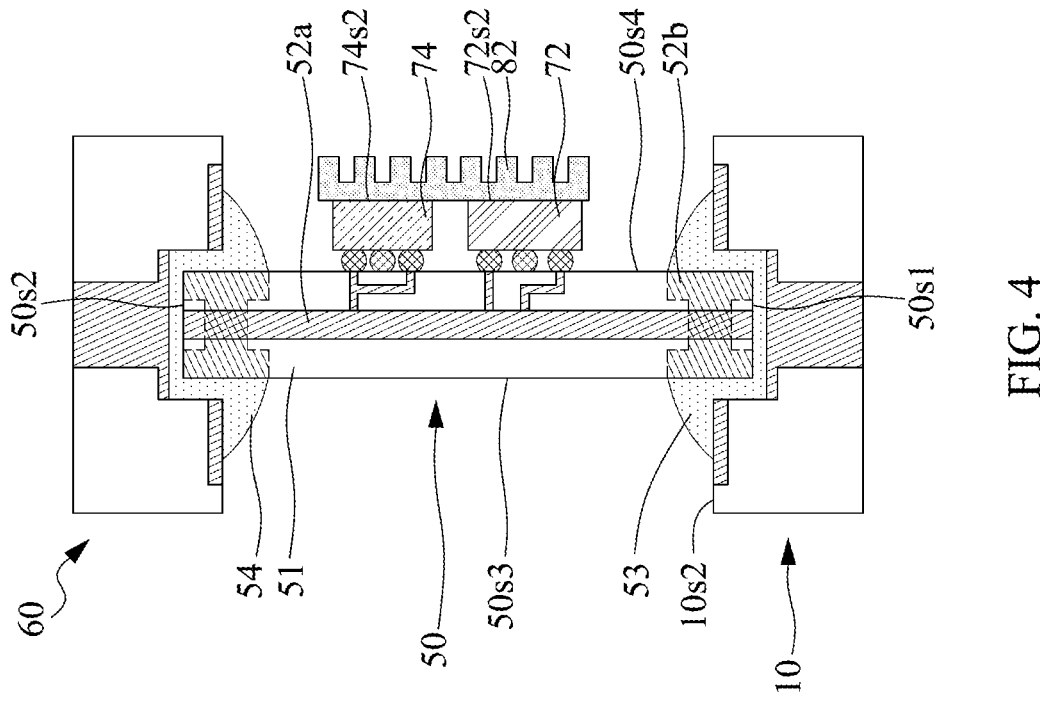
FIG. 4 illustrates a cross-sectional view of an electronic device, according to some embodiments of the present disclosure.

FIG. 4 illustrates a cross-sectional view of an electronic device 1c, according to some embodiments of the present disclosure. The electronic device 1c may be similar to the electronic device 1b, with differences therebetween as follows.

In some embodiments, the electronic device 1c may include a heat spreader 82. In some embodiments, the heat spreader 82 may be disposed on the surface 50s4 of the interposer 50. In some embodiments, the heat spreader 82 may be spaced apart from the interposer 50. In some embodiments, the heat spreader 82 may be disposed on the surface 72s2 of the power management integrated circuit 72. In some embodiments, the heat spreader 82 may be disposed on the surface 74s2 of the voltage regulator 74. The heat spreader 82 may be connected to the power management integrated circuit 72 (or voltage regulator 74) through an adhesive layer (not shown). The adhesive layer may include a conductive material, an insulation material, and/or a thermal conductive material. The heat spreader 82 may include a heat sink, such as heat dissipation fins as shown, extending along directions substantially perpendicular to the surface 50s4 of the interposer 50 from a base portion. In some embodiments, the heat spreader 82 may have one or more conductive layers. The heat spreader 82 may be positioned across a gap (not annotated) between the power management integrated circuit 72 and the voltage regulator 74. The heat spreader 82 may connect the power management integrated circuit 72 and the voltage regulator 74.

Figure 5:
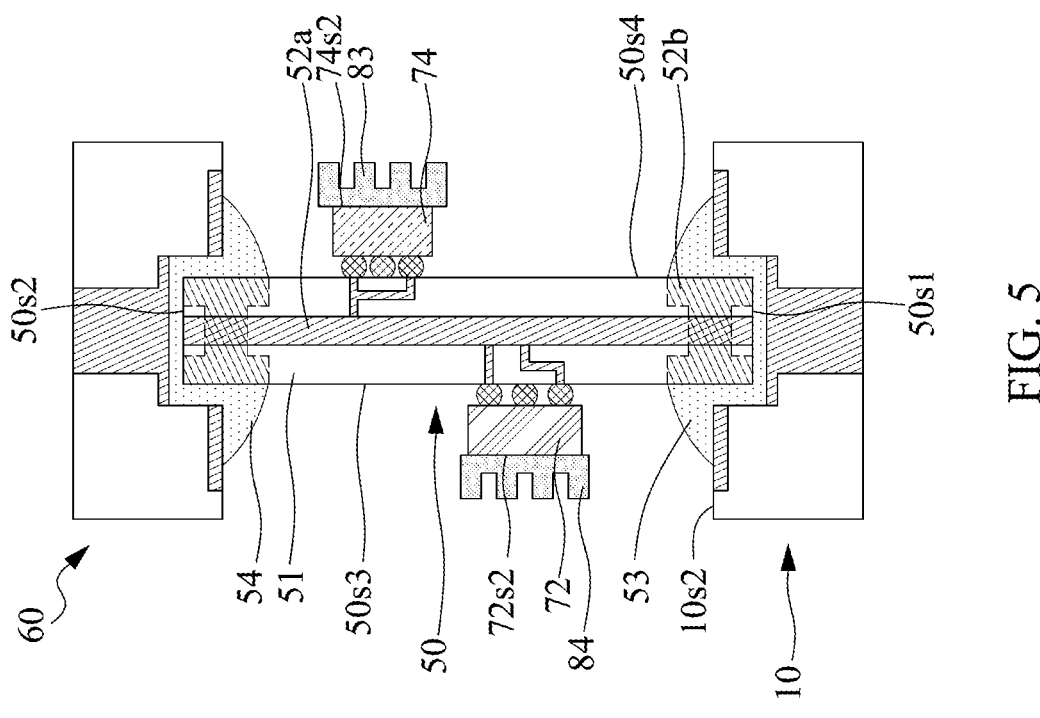
FIG. 5 illustrates a cross-sectional view of an electronic device, according to some embodiments of the present disclosure.

FIG. 5 illustrates a cross-sectional view of an electronic device 1d, according to some embodiments of the present disclosure. The electronic device 1d may be similar to the electronic device 1a, with differences therebetween as follows.

In some embodiments, the power management integrated circuit 72 may be disposed on the surface 50s3 of the interposer 50, and the voltage regulator 74 may be disposed on the surface 50s4 of the interposer 50.

The electronic device may include a heat spreader 83 and a heat spreader 84. The heat spreader 83 may be configured to facilitate dissipating heat from the voltage regulator 74. The heat spreader 83 may be disposed on the surface 74s2 of the voltage regulator 74. The heat spreader 83 may be disposed on the surface 50s4 of the interposer 50. The heat spreader 83 may include a heat sink. In some embodiments, the heat spreader 83 may have one or more conductive layers.

The heat spreader 84 may be configured to facilitate dissipating heat from the power management integrated circuit 72. The heat spreader 84 may be disposed on the surface 72s2 of the power management integrated circuit 72. The heat spreader 84 may be disposed on the surface 50s3 of the interposer 50. The heat spreader 84 may include a heat sink. In some embodiments, the heat spreader 84 may have one or more conductive layers.

Figure 6:
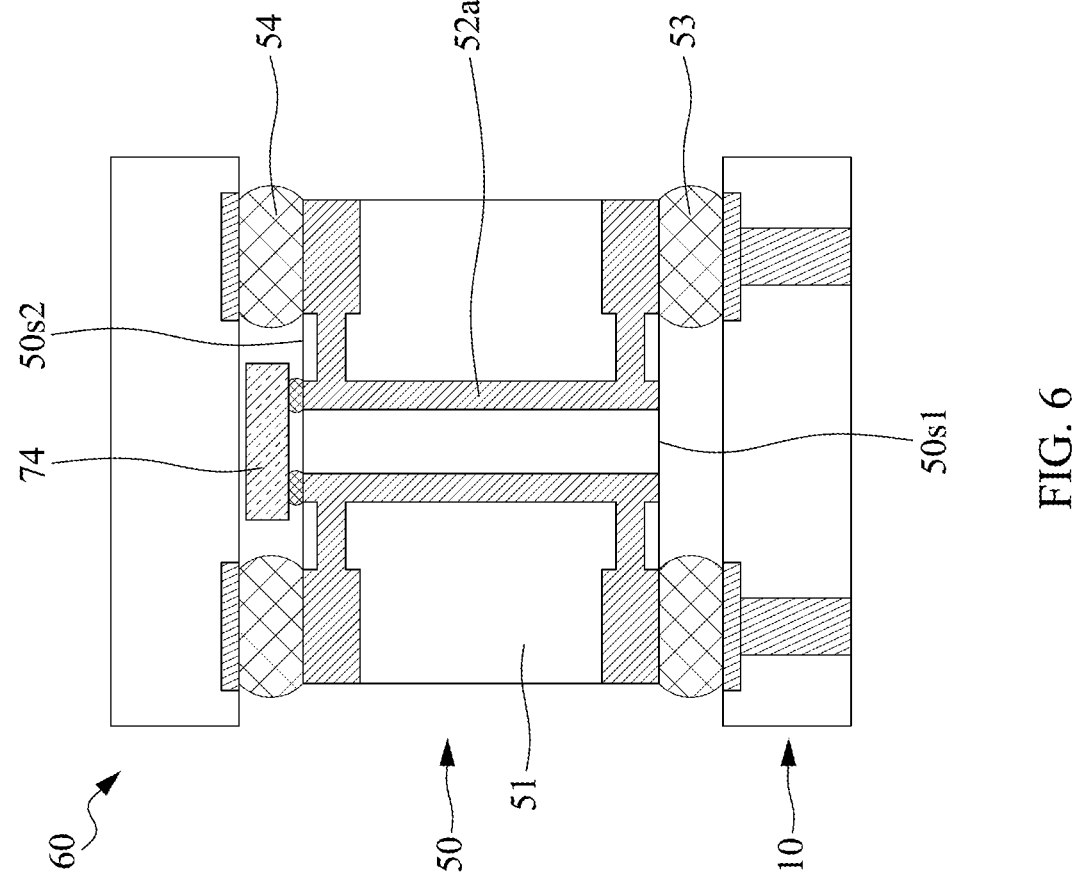
FIG. 6 illustrates a cross-sectional view of an electronic device, according to some embodiments of the present disclosure.

FIG. 6 illustrates a cross-sectional view of an electronic device 1e, according to some embodiments of the present disclosure. The electronic device 1e may be similar to the electronic device 1a, with differences therebetween as follows. It should be noted that some elements (e.g., conductive traces, pads, or other elements) of the circuit structures 10 and 60 and the interposer 50 are omitted from FIG. 6 or other figures for brevity.

In some embodiments, the voltage regulator 74 may be disposed on the surface 50s2 of the interposer 50. In some embodiments, the voltage regulator 74 may be disposed between the interposer 50 and the circuit structure 60. In some embodiments, the voltage regulator 74 may be disposed within a gap defined by or between the interposer 50 and the circuit structure 60. In some embodiments, the voltage regulator 74 may be disposed within a gap between the surface 50s2 (e.g., top surface) of the interposer 50 and the bottom surface (e.g., surface 60s1 as shown in FIG. 2A) of the circuit structure 60. In some embodiments, the voltage regulator 74 may be closer to the circuit structure 60 than to the circuit structure 10. In some embodiments, the voltage regulator 74 may be accommodated in a space defined by the interposer 50, the electrical connector 54, and the circuit structure 60. In some embodiments, the voltage regulator 74 may be disposed between the electrical connectors 54. The electrical connector 54 may be configured to protect the voltage regulator 74 from electromagnetic interference (EMI). Although not shown in FIG. 6, the power management integrated circuit 72 may be disposed on the surface 50s2 of the interposer 50. In this embodiments, the power management integrated circuit 72 may be closer to the circuit structure 60 than to the circuit structure 10. In comparison with a comparative example, the electronic device 1e may have a small thickness.

Figure 7:
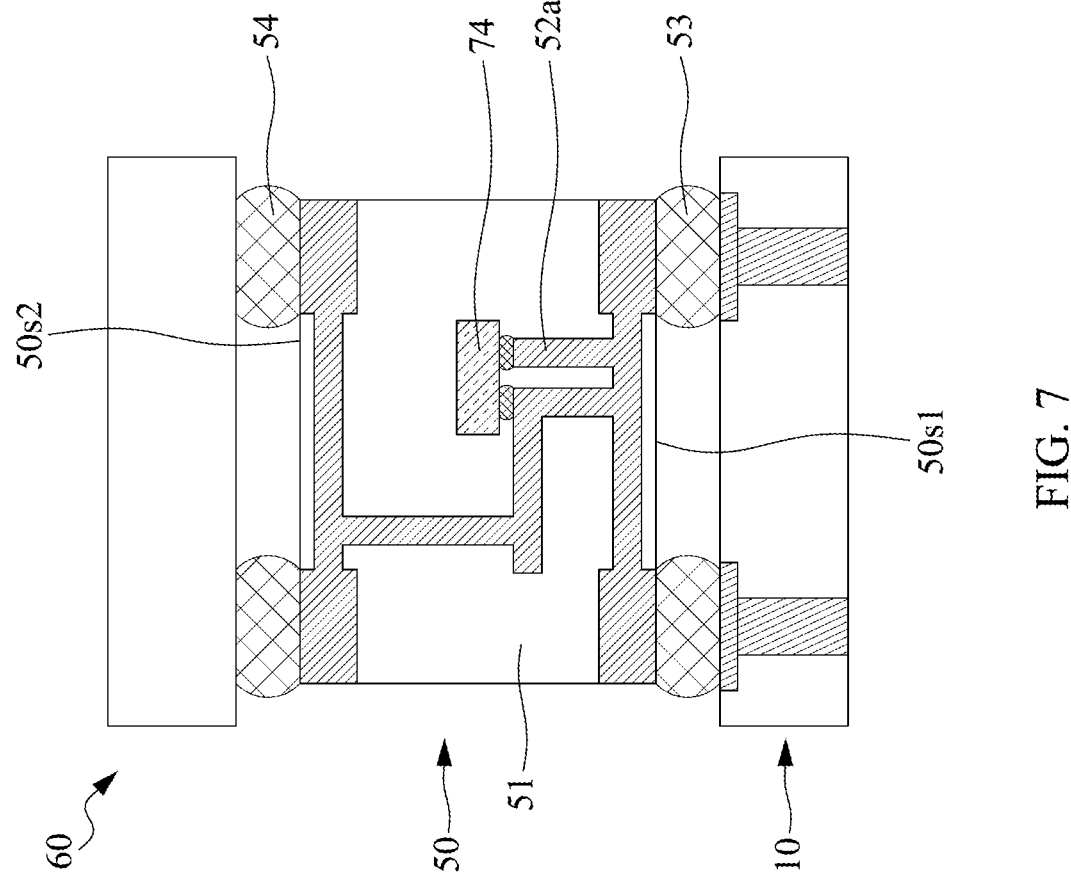
FIG. 7 illustrates a cross-sectional view of an electronic device, according to some embodiments of the present disclosure.
Figure 7:
Figure 7:
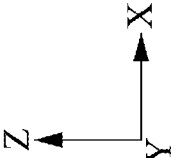

FIG. 7 illustrates a cross-sectional view of an electronic device 1f, according to some embodiments of the present disclosure. The electronic device 1*f* may be similar to the electronic device 1*a*, with differences therebetween as follows.

In some embodiments, the voltage regulator 74 may be embedded within the interposer 50. The voltage regulator 74 may be embedded within the substrate 51 of the interposer 50. Although not shown, the power management integrated circuit 72 may be embedded within the interposer 50. In this embodiment, the electronic device 1*f* may provide a shorter transmission path, which thereby reduces the power loss.

Figure 8:
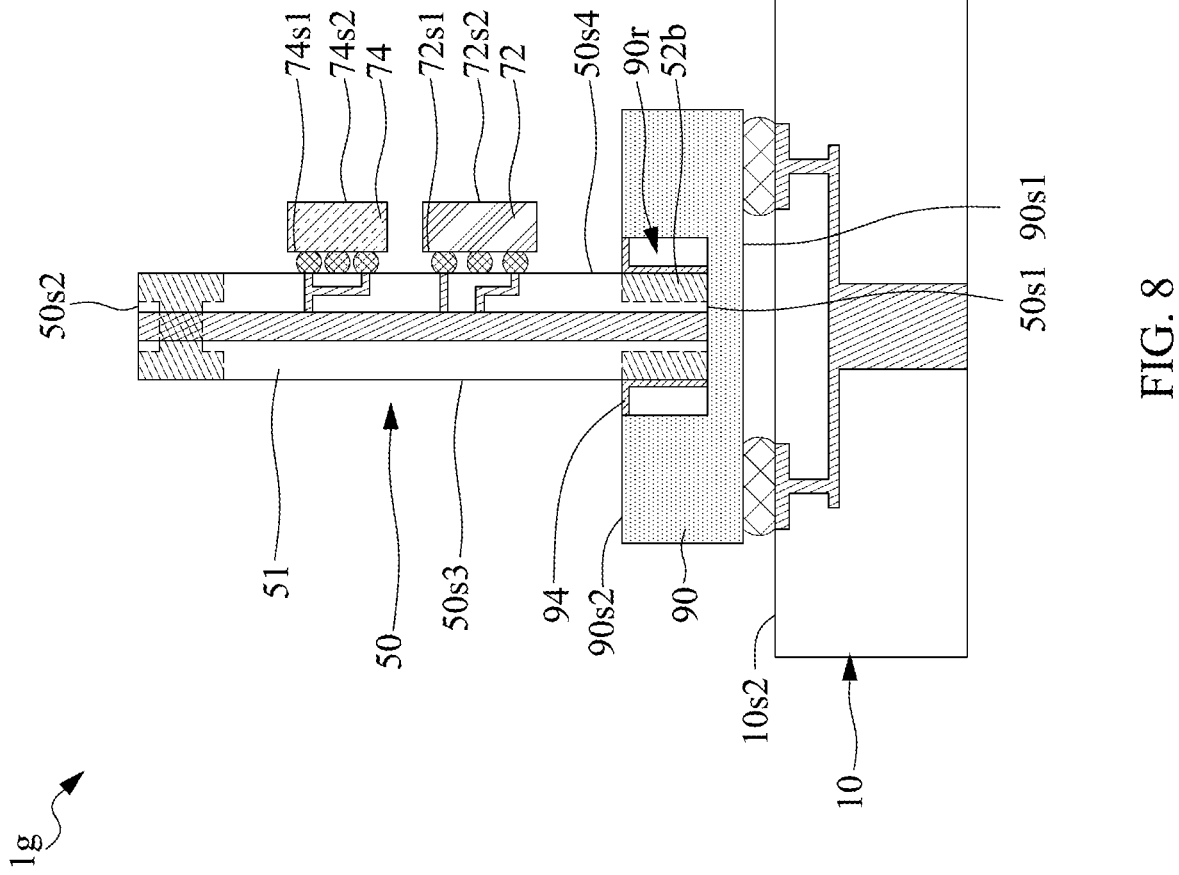
FIG. 8 illustrates a cross-sectional view of an electronic device, according to some embodiments of the present disclosure.

FIG. 8 illustrates a cross-sectional view of an electronic device 1*g*, according to some embodiments of the present disclosure. The electronic device 1*g* may be similar to the electronic device 1*a*, with differences therebetween as follows.

In some embodiments, the electronic device 1*g* may include a socket 90. The socket 90 may be configured to electrically connect the circuit structure 10 and the interposer 50. The socket 90 may include a redistribution structure (not shown) therein. The socket 90 may have a surface 90*s*1 (or a lower surface) and a surface 90*s*2 (or an upper surface) opposite to the surface 90*s*1. The socket 90 may define a recess 90*r* recessed from the surface 90*s*2. In some embodiments, the interposer 50 may be inserted into or located within the recess 90*r* of the socket 90. In some embodiments, the surface 50*s*1 of the interposer 50 may be in contact with the bottom of the recess 90*r*.

In some embodiments, a fixer 94 may be disposed within the recess 90*r*. The fixer 94 may be configured to fix the interposer 50. The fixer 94 may surround the interposer 50. In some embodiments, the interposer 50 may be spaced apart from the sidewall of the recess 90*r* by the fixer 94. The fixer 94 may be configured to electrically connect the socket 90 and the interposer 50. The fixer 94 may have a relatively great flexibility and deformability. When the power delivery trace 52*b* is disposed against the fixer 94, the fixer 94 may provide the interposer 50 with a reaction force so that the interposer 50 may be fastened over the circuit structure 10. In some embodiments, the fixer 94 may have a horizontal portion extending between the socket 90 and the interposer 50 and a vertical portion contacting the terminal (e.g., a conductive pad) of the interposer 50. In some embodiments, the fixer 94 may include a metal, alloy, or other suitable materials. The socket 90 may provide a relatively large surface area which the interposer 50 contacts. As a result, the resistance may be reduced, leading to an improvement of power loss.

Although not shown, the electronic device 1*g* may include an additional socket configured to connect the interposer 50 and the circuit structure 60. The additional socket may define a recess to accommodate the interposer 50.

Figure 9:
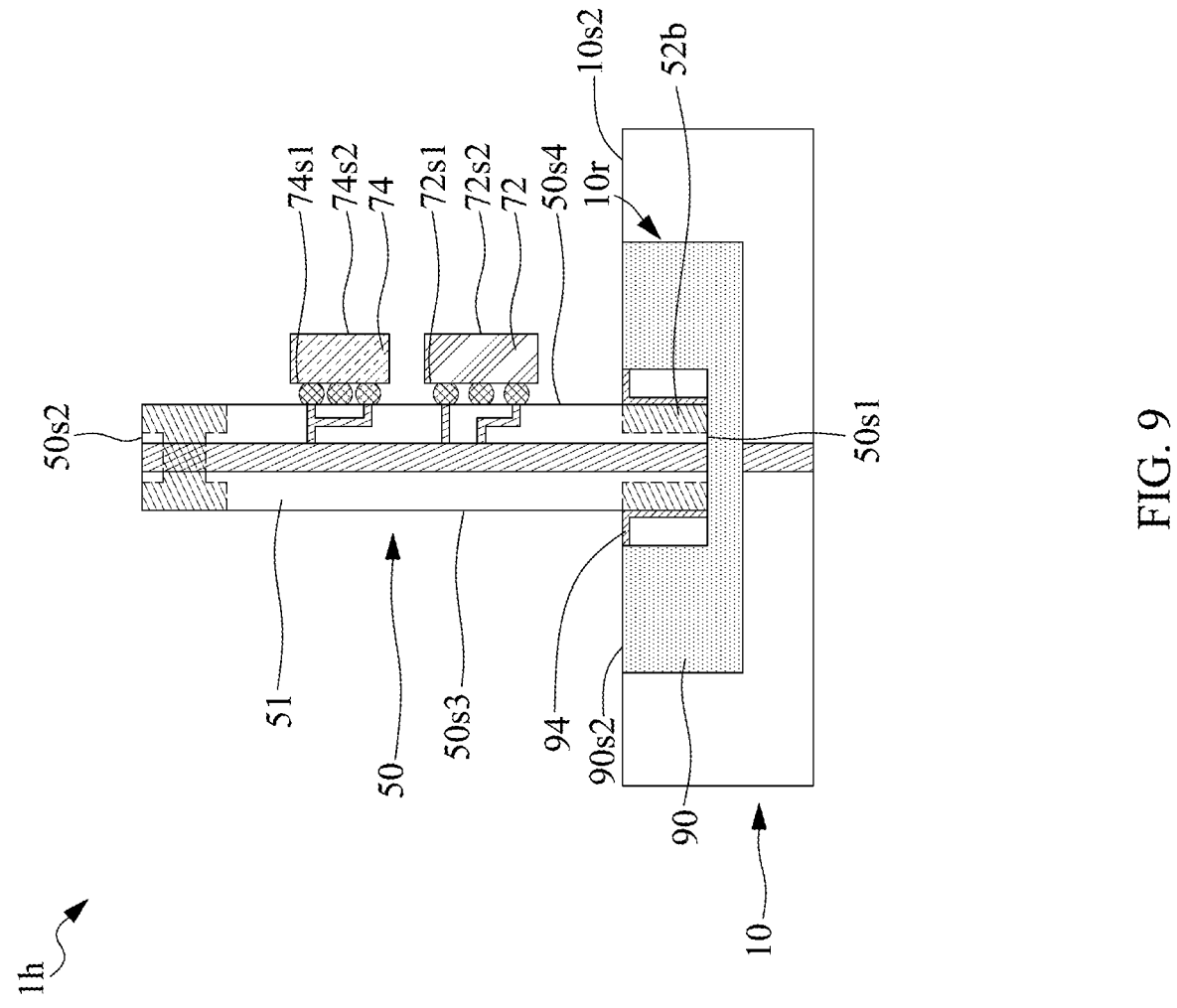
FIG. 9 illustrates a cross-sectional view of an electronic device, according to some embodiments of the present disclosure.

FIG. 9 illustrates a cross-sectional view of an electronic device 1*h*, according to some embodiments of the present disclosure. The electronic device 1*h* may be similar to the electronic device 1*g*, with differences therebetween as follows.

In some embodiments, the socket 90 may be embedded within the recess 10*r* of the circuit structure 10. In some embodiments, the fixer 94 may be embedded within the recess 10*r* of the circuit structure 10. In this embodiment, the thickness of the electronic device 1*h* may be reduced.

Figure 10:
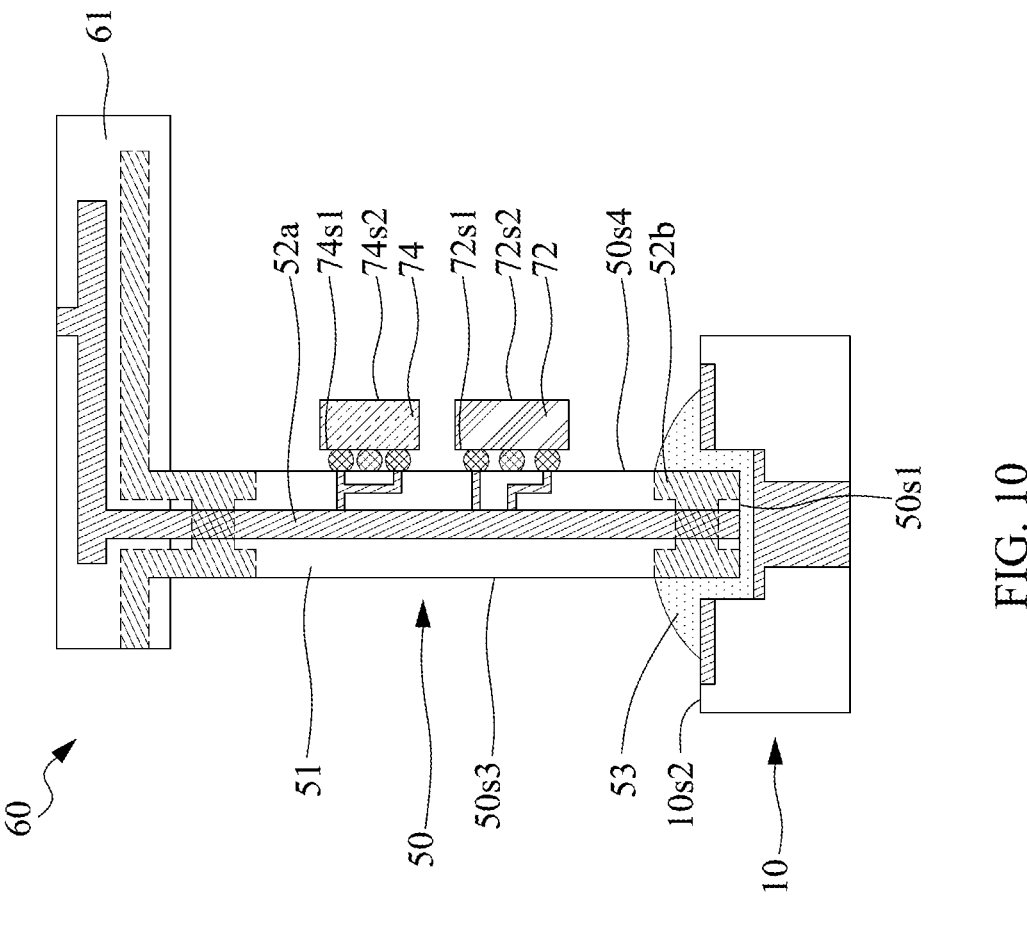
FIG. 10 illustrates a cross-sectional view of an electronic device, according to some embodiments of the present disclosure.
Figure 10:
Figure 10:
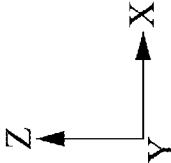

FIG. 10 illustrates a cross-sectional view of an electronic device 1*i*, according to some embodiments of the present disclosure. The electronic device 1*i* may be similar to the electronic device 1*a*, with differences therebetween as follows.

In some embodiments, the interposer 50 and the circuit structure 60 may be a monolithic structure. For example, the traces (e.g., power delivery trace 52*a*) may extend from the interposer 50 to the circuit structure 60 without boundaries. The substrates 51 and 61 may be made of the same materials.

Figure 11:
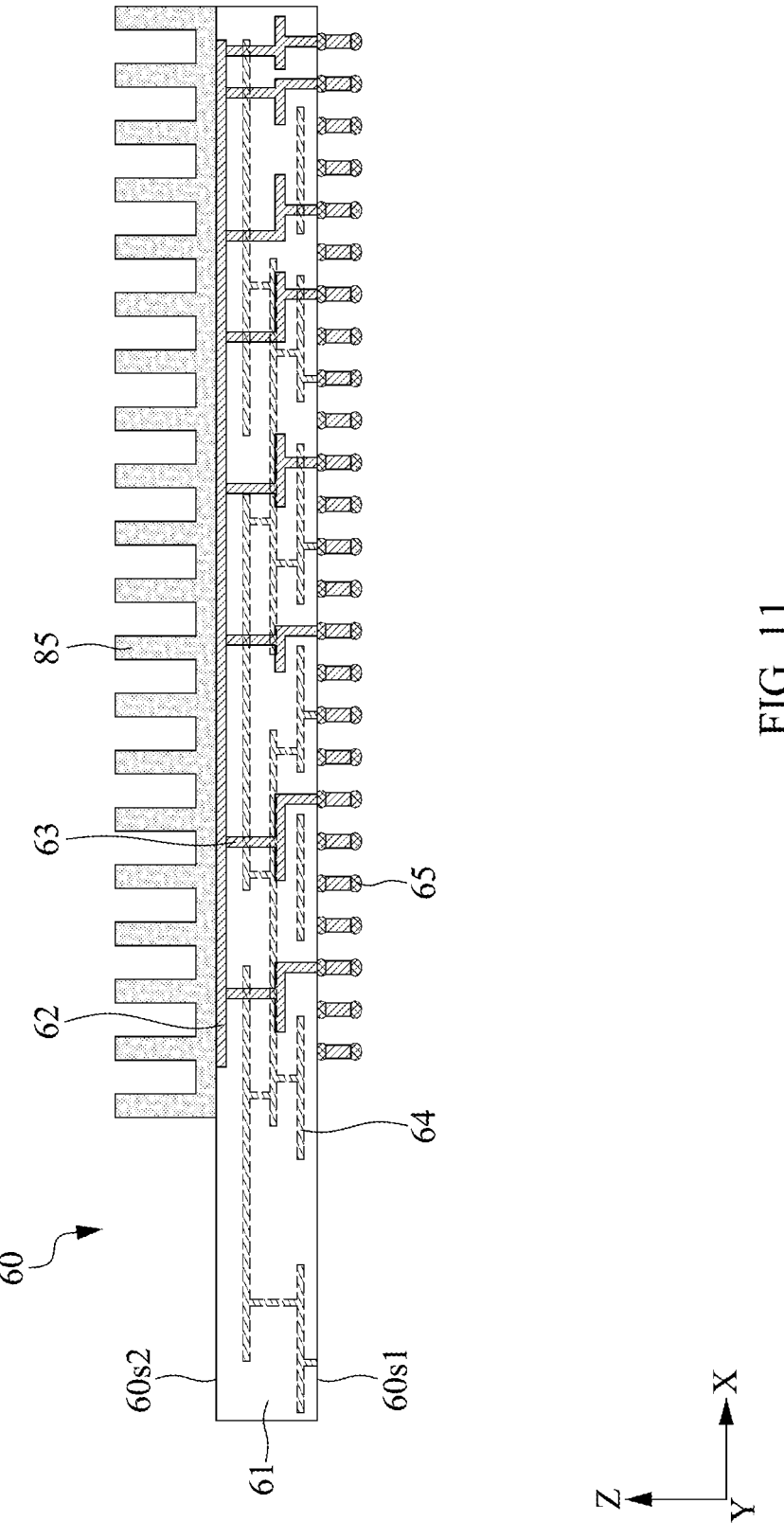
FIG. 11 illustrates a cross-sectional view of an electronic device, according to some embodiments of the present disclosure.

FIG. 11 illustrates a cross-sectional view of an electronic device 1*j*, according to some embodiments of the present disclosure. The electronic device 1*j* may be similar to the electronic device 1*a*, with differences therebetween as follows.

In some embodiments, the electronic device 1*j* may include a heat spreader 85. In some embodiments, the heat spreader 85 may be disposed on or over the surface 60*s*2 of the circuit structure 60. The heat spreader 85 may be in contact with the ground layer 62. The heat spreader 85 may include a heat sink, such as heat dissipation fins as shown, extending along directions substantially perpendicular to the surface 60*s*2 of the circuit structure 60 from a base portion. In some embodiments, a portion of the surface 60*s*2 of the circuit structure 60 may be exposed by the heat spreader. The heat spreader 85 may be configured to facilitate dissipating heat from circuit structure 60 to an external space of the electronic device 1*j*.

Figure 12:
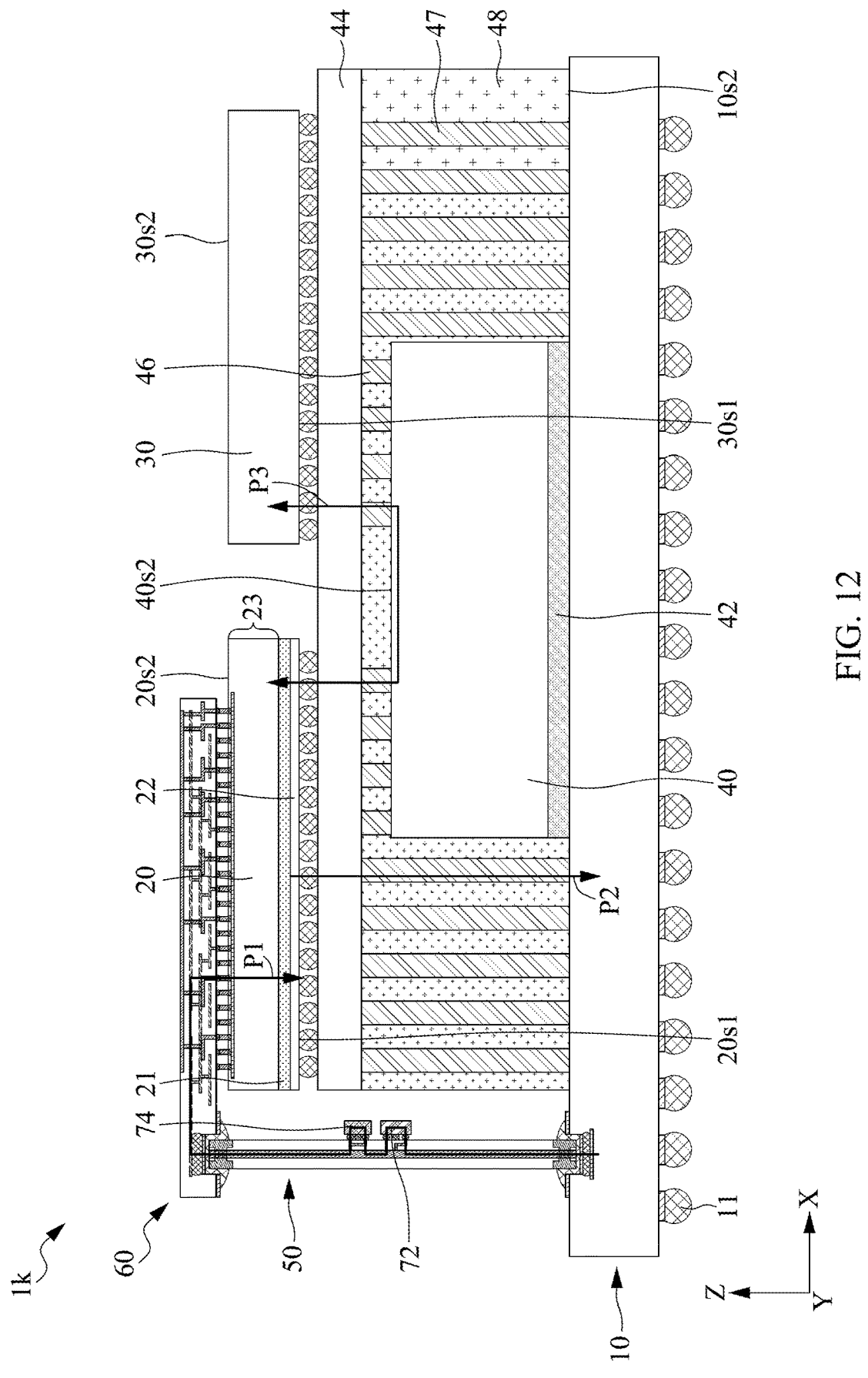
FIG. 12 illustrates a cross-sectional view of an electronic device, according to some embodiments of the present disclosure.

FIG. 12 illustrates a cross-sectional view of an electronic device 1*k*, according to some embodiments of the present disclosure. The electronic device 1*k* may be similar to the electronic device 1*a*, with differences therebetween as follows.

In some embodiments, the electronic device 1*k* may further include a carrier 44. The carrier 44 may be configured to support the electronic components 20 and 30. The carrier 44 may be disposed between the electronic component 20 and the bridge circuit 40. The carrier 44 may include a redistribution structure (not shown) for electrical connection of the bridge circuit 40 and the electronic components 20 and 30.

The bridge circuit 40 may include conductive structures 46 and 47. The conductive structure 46 may be disposed and electrically connected between the carrier 44 and the surface 40*s*2 of the bridge circuit 40. The conductive structure 46 may include, for example, a metal stud (e.g., copper stud) or other suitable elements. The conductive structure 47 may be disposed and electrically connected between the carrier 44 and the surface 10*s*2 of the circuit structure 10. The conductive structure 47 may include, for example, a metal pillar (e.g., copper pillar) or other suitable elements.

The electronic device 1*k* may include an encapsulant 48. The encapsulant 48 may be disposed between the surface 10*s*2 of the circuit structure 10 and the carrier 44. The encapsulant 48 may encapsulate the bridge circuit 40. The encapsulant 48 may encapsulate the conductive structures 46 and 47. In some embodiments, the encapsulant 48 may be made of molding material that may include, for example, a Novolac-based resin, an epoxy-based resin, a silicone-based resin, or another suitable encapsulant. Suitable fillers may also be included, such as powdered $SiO_2$. In this embodiment, the path P2 may further pass through the carrier 44. In this embodiment, the path P3 may further pass through the carrier 44.

Figure 13:
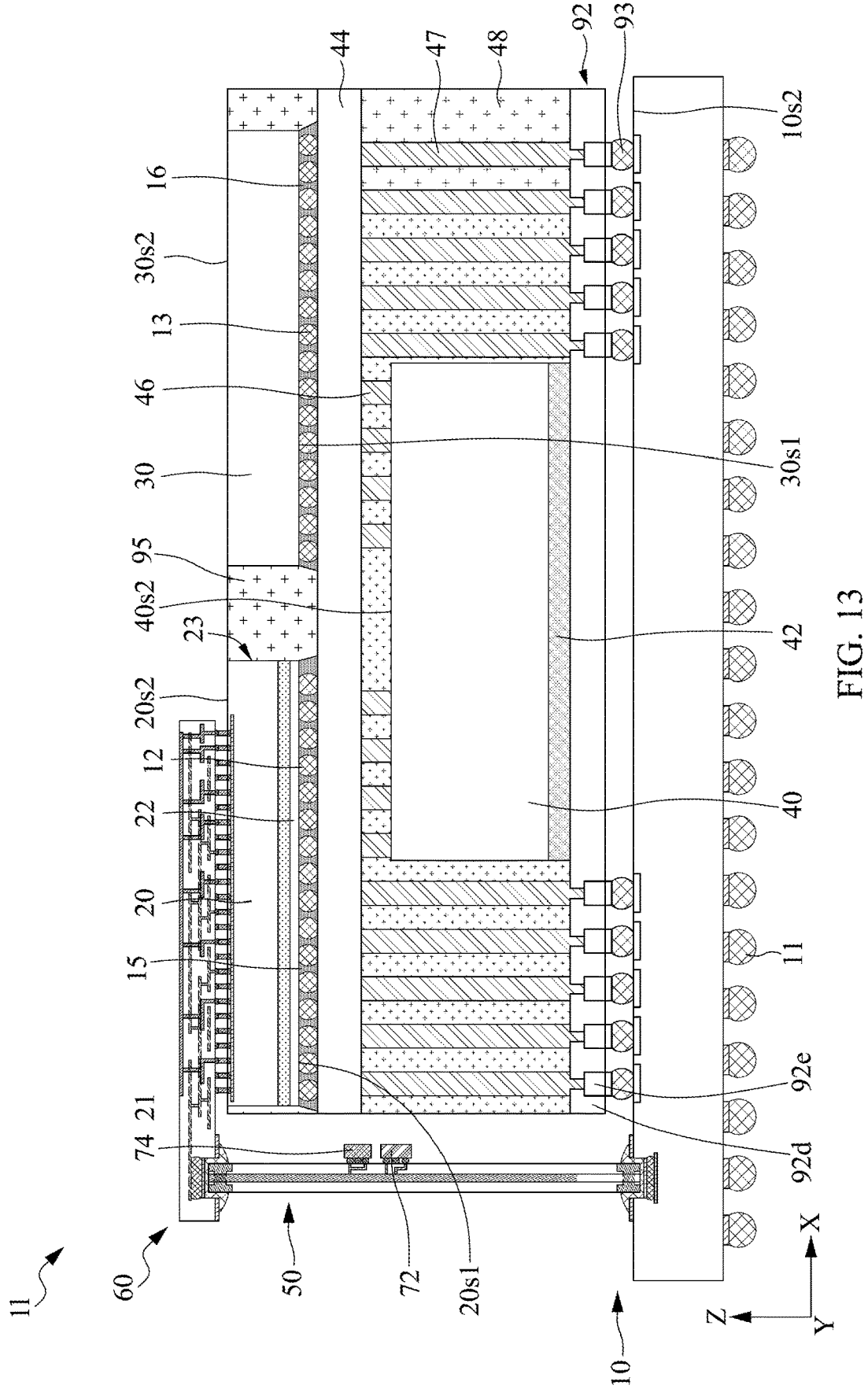
FIG. 13 illustrates a cross-sectional view of an electronic device, according to some embodiments of the present disclosure.

FIG. 13 illustrates a cross-sectional view of an electronic device 1*l*, according to some embodiments of the present disclosure. The electronic device 1*l* may be similar to the electronic device 1*k*, with differences therebetween as follows.

The electronic device 1*l* may further include an interconnection structure 92, electrical connectors 93, and an encapsulant 95. The interconnection structure 92 may be disposed on the circuit structure 10. The interconnection structure 92 may be configured to electrically connect the circuit structure 10 and the carrier 44. The interconnection structure 92 may include a dielectric structure 92d and conductive elements 92e embedded within the dielectric structure 92d. The dielectric structure 92d may include a benzocyclobutene based polymer or a polyimide. The conductive element 92e may include a conductive material(s), such as copper (Cu), aluminum (Al), tungsten (W), titanium (Ti), tantalum (Ta), or other applicable materials. In some embodiments, the conductive structure 47 may penetrate a portion of the dielectric structure 92d and be connected to the conductive element 92e.

The electrical connectors 93 may be disposed between the interconnection structure 92 and the circuit structure 10. The electrical connectors 93 may be electrically connect the interconnection structure 92 and the circuit structure 10. The electrical connectors 93 may include a solder element, which may include alloys of gold and tin solder or alloys of silver and tin solder, or other suitable materials.

In some embodiments, the electronic device 1l may include an underfill 15. The underfill 15 may encapsulate the electrical connectors. 12. In some embodiments, the electronic device 1l may include an underfill 16. The underfill 16 may encapsulate the electrical connectors. 13.

The encapsulant 95 may be disposed on the carrier 44. The encapsulant 95 may encapsulate the electronic component 20. The encapsulant 95 may encapsulate the electronic component 30. The encapsulant 95 may encapsulate the underfill 15. The encapsulant 95 may encapsulate the underfill 16. The encapsulant 95 may include insulation or dielectric materials. In some embodiments, the encapsulant 95 may be made of molding material that may include, for example, a Novolac-based resin, an epoxy-based resin, a silicone-based resin, or another suitable encapsulant. Suitable fillers may also be included, such as powdered $SiO_2$.

Figure 14:
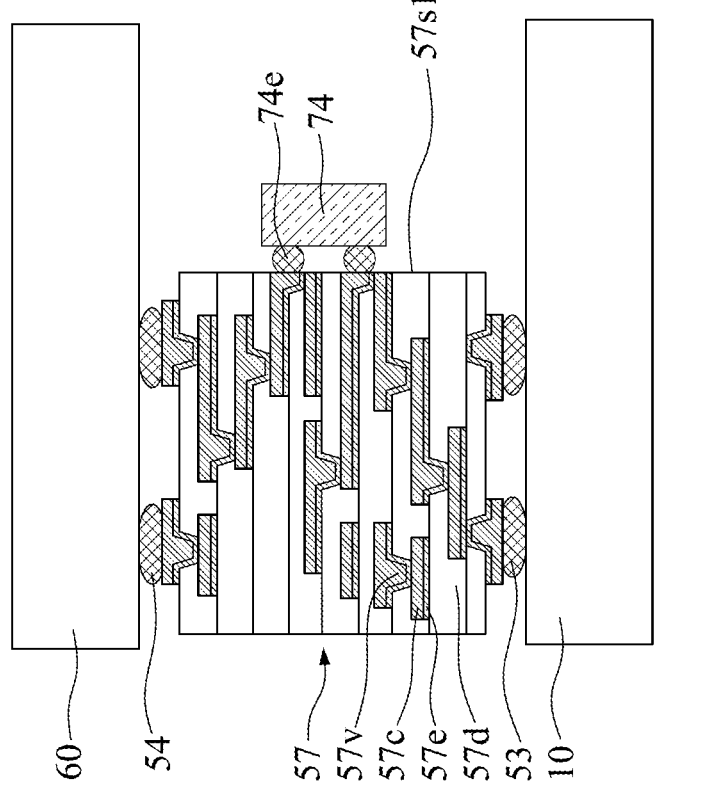
FIG. 14 illustrates a cross-sectional view of an electronic device, according to some embodiments of the present disclosure.

FIG. 14 illustrates a cross-sectional view of an electronic device 1m, according to some embodiments of the present disclosure. The electronic device 1m may be similar to the electronic device 1b, with differences therebetween as follows.

In some embodiments, the interposer 50 may be replaced by an interposer 57. The interposer 57 may be electrically connected to a circuit structure 10 by electrical connectors 53. The interposer 57 may be electrically connected to a circuit structure 60 by electrical connectors 54. The voltage regulator 74 may be disposed on a surface 57s1 (or a lateral surface) of the interposer 57. The interposer 57 may include dielectric layers 57d, seed layers 57e, conductive layers 57c, and conductive vias 57v. The dielectric layer 57d may include a benzocyclobutene (BCB) based polymer or a polyimide (PI). The seed layer 57e may be disposed on the dielectric layer 57d. The seed layer 57e may include titanium (Ti), copper (Cu), titanium nitride (TiN), or other suitable materials. The conductive layer 57c may be disposed on the seed layer 57e. The conductive via 57v may extend between the seed layer 57e and the conductive layer 57c. The conductive via 57v may be tapered toward the circuit structure 10. Although not shown in FIG. 14, the power management integrated circuit 72 may be disposed on the surface 57s1 of the interposer 57.

Figure 15:
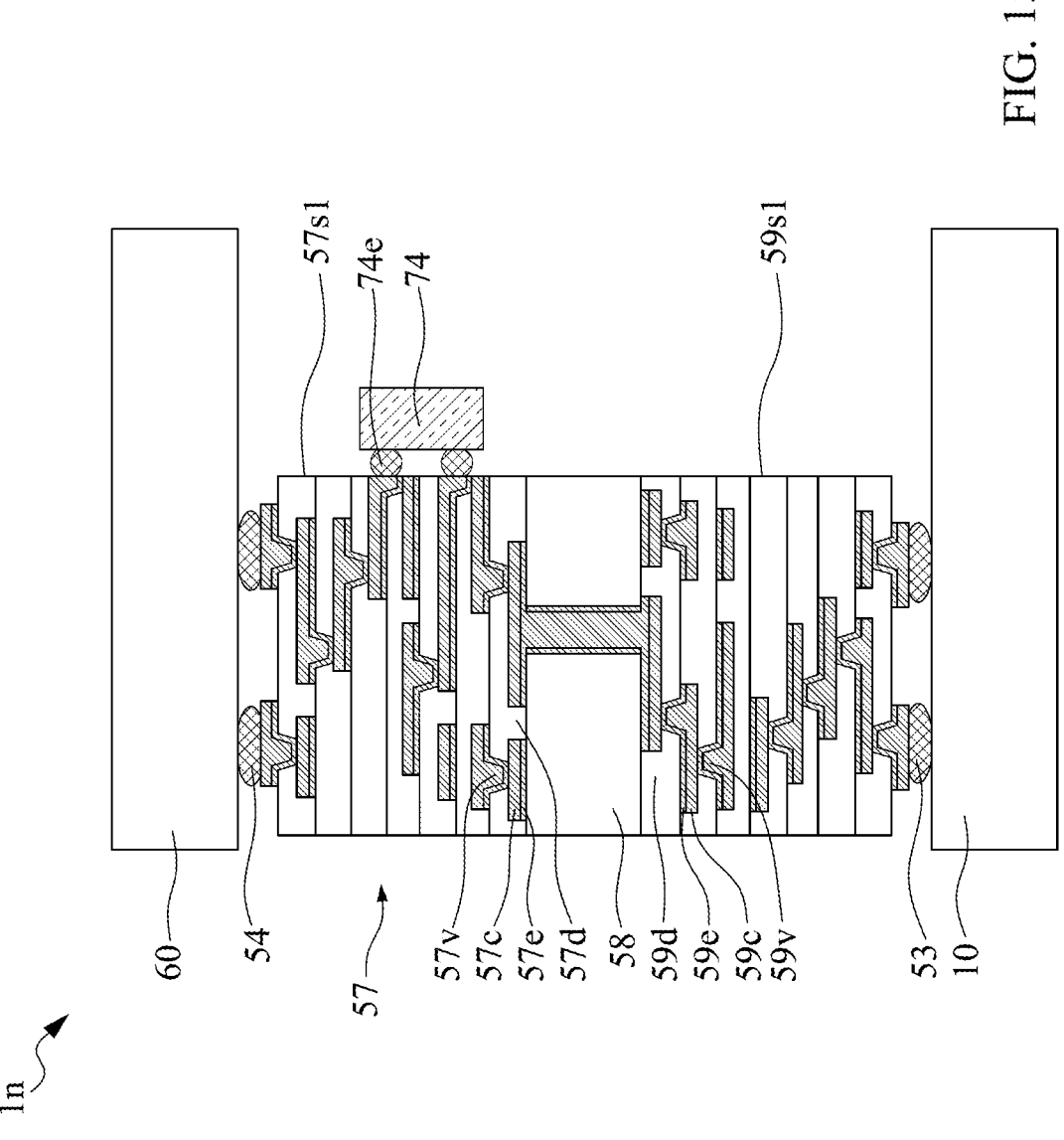
FIG. 15 illustrates a cross-sectional view of an electronic device, according to some embodiments of the present disclosure.

FIG. 15 illustrates a cross-sectional view of an electronic device 1n, according to some embodiments of the present disclosure. The electronic device 1n may be similar to the electronic device 1m, with differences therebetween as follows.

The electronic device 1n may further include a core substrate 58 and an interposer 59. The core substrate 58 may be disposed between the interposers 57 and 59. The core substrate 58 may include a through via (not annotated) penetrating the core substrate 58 and electrically connecting the interposers 57 and 59. The interposer 59 may be electrically connected to the circuit structure 10 by the electrical connectors 53. The interposer 59 may include dielectric layers 59d, seed layers 59e, conductive layers 59c, and conductive vias 59v. The dielectric layer 59d may include a benzocyclobutene (BCB) based polymer or a polyimide (PI). The seed layer 59e may be disposed on the dielectric layer 59d. The seed layer 59e may include titanium (Ti), copper (Cu), titanium nitride (TiN), or other suitable materials. The conductive layer 59c may be disposed on the seed layer 59e. The conductive via 59v may extend between the seed layer 59e and the conductive layer 59c. The conductive via 59v may be tapered toward the circuit structure 60. Although FIG. 15 illustrates that the voltage regulator 74 is disposed on the surface 57s1 of the interposer 57, the voltage regulator 74 may be disposed on a surface 59s1 (oa a lateral surface) of the interposer 59.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to #1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 10+S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
an interposer;
a voltage regulator attached to the interposer and overlapping the interposer along a first direction;
a first circuit structure supported by the interposer and overlapping the interposer and the voltage regulator along a second direction substantially orthogonal to the first direction; and
an electronic component disposed adjacent to the interposer and electrically connected to the voltage regulator through the first circuit structure and the interposer, wherein the electronic component overlaps the interposer and the voltage regulator along the first direction and overlaps the first circuit structure along the second direction, and wherein the first circuit structure has a first surface and a second surface over the first surface, and the interposer, the voltage regulator, and the electronic component are disposed under the first surface of the first circuit structure along the second direction.

2. The electronic device of claim 1, wherein the first circuit structure covers the voltage regulator and the electronic component, and the interposer is configured to transmit a power passing by a lateral side surface of the electronic component.

3. The electronic device of claim 2, wherein the electronic component comprises a first surface, a second surface and a logic circuit closer to the first surface than to the second surface, and the logic circuit is configured to receive the power from the first circuit structure through the second surface of the electronic component, and wherein the lateral side surface of the electronic component extends between the first surface and the second surface of the electronic component.

4. The electronic device of claim 3, wherein the second surface of the electronic component is a passive surface.

5. The electronic device of claim 1, wherein the voltage regulator has a passive surface and an active surface disposed between the interposer and the passive surface of the voltage regulator, and the active surface of the voltage regulator extends along a direction substantially orthogonal to an active surface of the electronic component.

6. The electronic device of claim 5, wherein the voltage regulator is disposed between the interposer and the electronic component along the first direction, the voltage regulator is electrically connected to the interposer through a solder material between the voltage regulator and the interposer along the first direction, and the solder material overlaps the first circuit structure along the second direction.

7. The electronic device of claim 5, wherein a lateral side surface of the interposer is substantially parallel to a lateral side surface of the electronic component.

8. The electronic device of claim 7, wherein the lateral side surface of the interposer overlaps the lateral side surface of the electronic component along the first direction.

9. The electronic device of claim 8, wherein the first circuit structure and the interposer define a substantially L-shaped profile.

10. The electronic device of claim 1, further comprising:
a heat spreader adjacent to the interposer and covered by the first circuit structure, wherein the heat spreader overlaps the voltage regulator along the first direction and overlaps the first circuit structure along the second direction.

11. The electronic device of claim 10, wherein the voltage regulator is disposed at a first side of the interposer and the heat spreader is disposed at a second side of the interposer opposite to the first side.

12. The electronic device of claim 10, wherein the voltage regulator is connected to the heat spreader.

13. An electronic device, comprising:
a first circuit structure;
a second circuit structure disposed under the first circuit structure;
a voltage regulator configured to transmit a power between the first circuit structure and the second circuit structure, wherein the voltage regulator vertically overlaps the first circuit structure and the second circuit structure along a first direction; and
an electronic component disposed between the first circuit structure and the second circuit structure along the first direction, wherein the electronic component is configured to receive the power, and the voltage regulator extends along a second direction substantially orthogonal to the first direction.

14. The electronic device of claim 13, further comprising: a heat spreader disposed between the electronic component and the voltage regulator along the second direction.

15. The electronic device of claim 14, wherein the heat spreader is disposed between the first circuit structure and the second circuit structure along the first direction.

16. The electronic device of claim 14, wherein the electronic component is connected to the first circuit structure.

17. The electronic device of claim 16, wherein the electronic component is connected to the second circuit structure.

18. The electronic device of claim 13, wherein the first circuit structure has a top surface and a bottom surface, and the first circuit structure comprises a thermal dissipating layer closer to the top surface than to the bottom surface.

19. An electronic device, comprising:
a first circuit structure;

an interposer connected to the first circuit structure along a first direction; and an electronic component overlapping the interposer along a second direction substantially orthogonal to the first direction, wherein the first circuit structure and the interposer define a space to accommodate a voltage regulator, an active surface of the voltage regulator extends along the first direction, and an active surface of the electronic component extends along the second direction in a cross-sectional view.

20. The electronic device of claim 19, further comprising a second circuit structure disposed under the first circuit structure along the first direction, wherein the electronic component has a first surface facing the first circuit structure and a second surface facing the second circuit structure, and the electronic component is configured to receive a power from the first circuit structure through the first surface and configured to transmit a signal to the second circuit structure through the second surface.

* * * * *